(12) United States Patent  
Jang et al.

(10) Patent No.: US 9,283,644 B2
(45) Date of Patent: Mar. 15, 2016

(54) HEATING APPARATUS FOR MANUFACTURING DISPLAY DEVICE

(71) Applicant: LG Display Co., Ltd., Seoul (KR)

(72) Inventors: Chul Young Jang, Daegu (KR); Hyun Taek Lim, Busan (KR); Joo Hwan Hwang, Daegu (KR); Jun Ho Yu, Daegu (KR); Seok Min Hong, Daegu (KR)

(73) Assignee: LG Display Co., Ltd., Seoul (KR)

( * ) Notice: Subject to any disclaimer, the term of this patent is extended or adjusted under 35 U.S.C. 154(b) by 539 days.

(21) Appl. No.: 13/709,256

(22) Filed: Dec. 10, 2012

(65) Prior Publication Data

US 2013/0340224 A1 Dec. 26, 2013

(30) Foreign Application Priority Data

Jun. 20, 2012 (KR) .................. 10-2012-0066405

(51) Int. Cl.
| | | |
|---|---|---|
| *C23C 16/00* | (2006.01) | |
| *B23P 25/00* | (2006.01) | |
| *H01L 51/56* | (2006.01) | |
| *C23C 14/26* | (2006.01) | |

(52) U.S. Cl.
CPC ............... *B23P 25/00* (2013.01); *C23C 14/26* (2013.01); *H01L 51/56* (2013.01); *Y10T 29/51* (2015.01)

(58) Field of Classification Search
CPC ..................................................... B23P 25/00
USPC ................................................. 118/726, 727
See application file for complete search history.

(56) References Cited

U.S. PATENT DOCUMENTS

| | | | |
|---|---|---|---|
| 5,506,389 A | * | 4/1996 | Hidano et al. ................ 219/390 |
| 6,282,368 B1 | | 8/2001 | Horie et al. |
| 2005/0034672 A1 | * | 2/2005 | Lee ....................... C23C 14/243 |
| | | | 118/726 |

FOREIGN PATENT DOCUMENTS

| | | | |
|---|---|---|---|
| KR | 10-2002-0021937 A | | 3/2002 |
| KR | 10-0670360 B1 | | 1/2007 |
| KR | 10-2007-0055089 A | | 5/2007 |
| KR | 10-0768899 B1 | | 10/2007 |
| KR | 10-1011067 B | | 1/2011 |
| TW | 565626 B | | 12/2003 |
| TW | 200737288 A | | 10/2007 |
| WO | 2005/061756 A1 | | 7/2005 |
| WO | 2007/081185 A1 | | 7/2007 |
| WO | 2009/136670 A1 | | 11/2009 |

OTHER PUBLICATIONS

English translation KR 2006-0012718, Jan. 2011, Kim.*
English translation KR 2007-0055089, Nov. 2005, Kim.*

* cited by examiner

*Primary Examiner* — Keath Chen
(74) *Attorney, Agent, or Firm* — Morgan, Lewis & Bockius LLP

(57) ABSTRACT

Disclosed is a heating apparatus for manufacturing a display device, which prevents damage or breakage even though a heating member is deformed by heat, and extends a period for replacement of the heating member, wherein the heating apparatus comprises the heating member for emitting heat so as to heat a material to be deposited on a substrate prepared for manufacturing the display device, a first installing device for supporting the heating member, and a second installing device provided with a passing hole for passing the other end of the heating member therethrough.

13 Claims, 11 Drawing Sheets

HEATING APPARATUS FOR MANUFACTURING DISPLAY DEVICE

CROSS REFERENCE TO RELATED APPLICATIONS

This application claims the benefit of Korean Patent Application No. 10-2012-0066405 filed on Jun. 20, 2012, which is hereby incorporated by reference as if fully set forth herein.

BACKGROUND

1. Field of the Invention

The present invention relates to a heating apparatus for manufacturing a display device.

2. Discussion of the Related Art

Display devices of organic light emitting diodes (OLED), liquid crystal display (LCD), plasma display panel (PDP) and electrophoretic display (EPD) are manufactured by various processes. These processes may include a deposition process for depositing a thin film on a substrate, and an etching process for removing the thin film according to a predetermined pattern. For example, the OLED may be manufactured by depositing a thin film on a substrate through an evaporation process of inorganic or metal material. Herein, an apparatus used for this process is disclosed in the Korean Patent Application No. P10-0670360 (dated on Jan. 16, 2007).

FIG. 1 is a cross-sectional side view illustrating a deposition apparatus according to the related art and a heating apparatus used for the deposition apparatus.

Referring to FIG. 1, a deposition apparatus 10 according to the related art includes a chamber 11 for carrying out a process of forming a thin film on a substrate 100, and a heating apparatus 12 for evaporating a material for forming the thin film.

The heating apparatus 12 includes a container 121 for holding the material therein, and a heating member 122 for heating the material held in the container 121. The heating member 122 combined with the container 121 covers the external of the container 121. When the heating member 122 is supplied with power, the heating member 122 emits heat, to thereby heat the material held in the container 121. Accordingly, the material held in the container 121 is evaporated and is then transferred toward the substrate 100, to thereby form the thin film on the substrate 100. The heating member 122 emits the heat with a considerably-high temperature so as to evaporate the material held in the container 121. For example, if the material held in the container 121 is the inorganic or metal material, the heating member 122 emits the heat of high temperature above about 1,000° C.

In case of the deposition apparatus 10 according to the related art, the plurality of heating members 122 covering the container 121 in a horizontal direction (X-axis direction) is combined with the container 121 in a vertical direction (Z-axis direction). Thus, during the process of emitting the heat of high temperature, the heating member 122 is deformed in a lower-side direction (direction of arrow 'A') due to the force of gravity, whereby the heating member 122 is moved toward the lower-side direction (direction of arrow 'A'). Accordingly, due to the heating member 122 moved in the deposition apparatus 10, the position of the heating member 122 combined with the container 121 is changed so that it is difficult to uniformly heat the material held in the container 121. The deposition apparatus 10 according to the related art has a short period for repair or replacement of the heating member 122. Furthermore, during the process for repair or replacement of the heating member 122, the process for depositing the thin film on the substrate 100 should be stopped, to thereby lower productivity for a process for manufacturing a display device.

SUMMARY

Accordingly, the present invention is directed to a heating apparatus for manufacturing a display device that substantially obviates one or more problems due to limitations and disadvantages of the related art.

An aspect of the present invention is to provide a heating apparatus for manufacturing a display device, which prevents damage or breakage even though a heating member is deformed by heat.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a heating apparatus for manufacturing a display device comprising: a heating member for emitting heat so as to heat a material to be deposited on a substrate prepared for manufacturing the display device; a first installing device for supporting the heating member, wherein one end of the heating member is installed in the first installing device; and a second installing device provided at a predetermined distance from the first installing device, wherein the other end of the heating member is installed in the second installing device, wherein the second installing device includes a passing hole through which the other end of the heating member passes, so that the heating member deformed by the heat expands or shrinks with respect to a portion supported by the first installing device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a heating apparatus for manufacturing a display device according to the present invention will be described with reference to the accompanying drawings.

Figure 1:
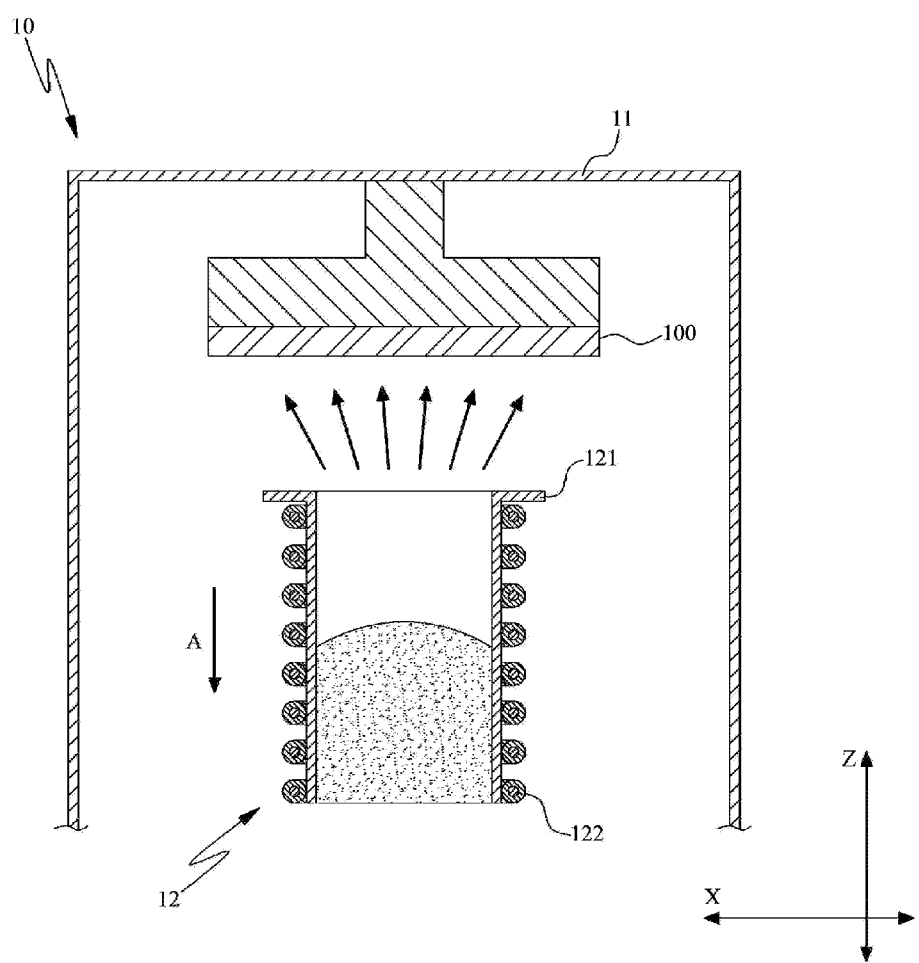
FIG. 1 is a cross-sectional side view illustrating a deposition apparatus according to the related art and a heating apparatus used for the deposition apparatus.
Figure 2:
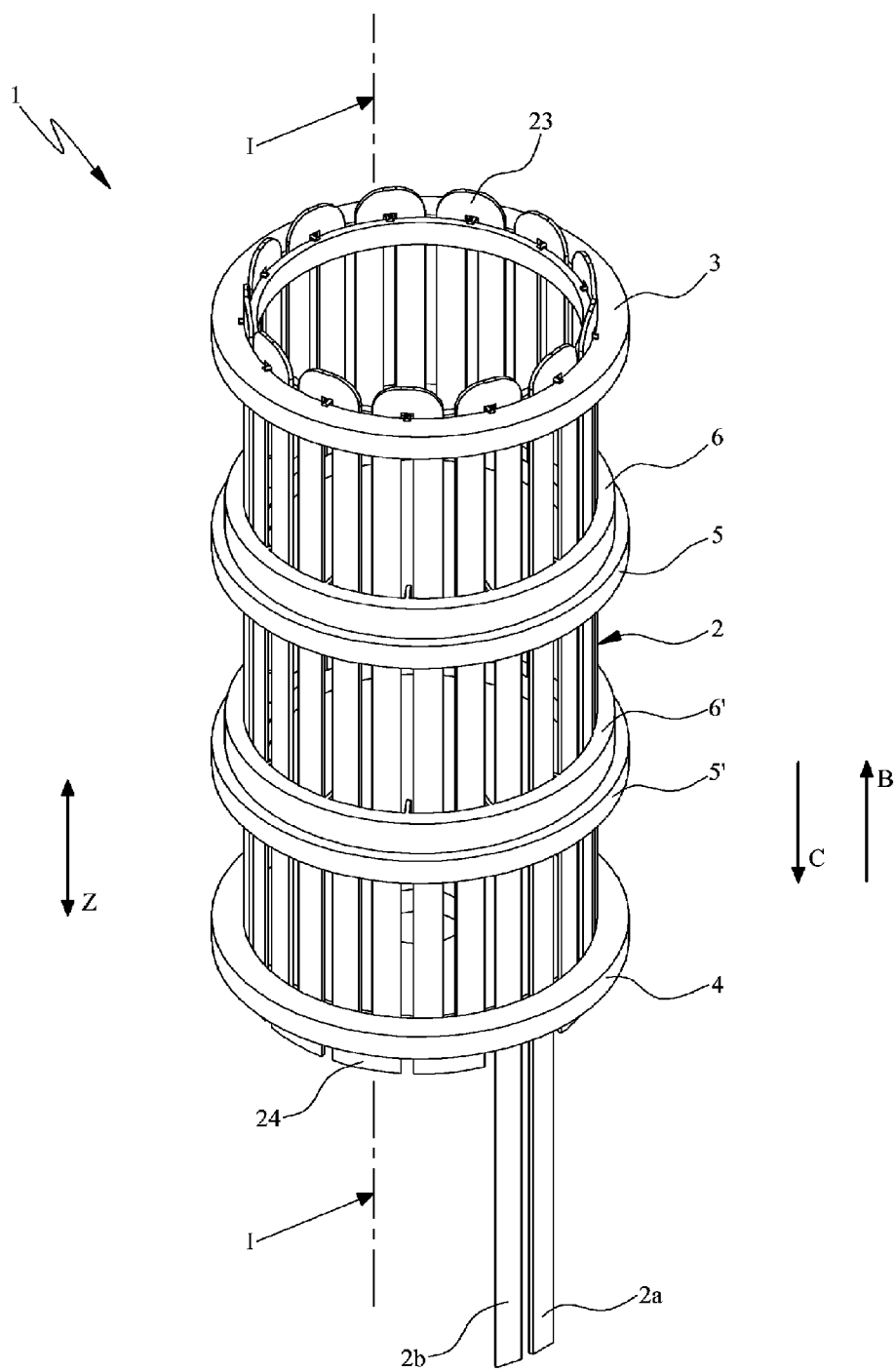
FIG. 2 is a perspective view illustrating a heating apparatus for manufacturing a display device according to the present invention.

Referring to FIG. 2, a heating apparatus 1 for manufacturing a display device (hereinafter, referred to as 'heating apparatus') according to the present invention is used to manufacture display devices such as organic light emitting diodes (OLED), liquid crystal display (LCD), plasma display panel (PDP) and electrophoretic display (EPD). This heating apparatus 1 according to the present invention may be provided in an apparatus of depositing a thin film on a substrate (See '100' of FIG. 1). For example, the heating apparatus 1 according to the present invention may be provided in an apparatus of depositing the thin film on the substrate by evaporating a material, wherein the heating apparatus 1 according to the present invention may heat the material. The material evaporated by heating is transferred to the substrate (See '100' of FIG. 1), and is then deposited on the substrate (See '100' of FIG. 1), whereby the thin film is formed on the substrate (See '100' of FIG. 1). Herein, the material may be an organic material, an inorganic material, or a metal material for forming a cathode. The material held in a container (not shown) may be heated by the heating apparatus 1 according to the present invention.

Figure 3:
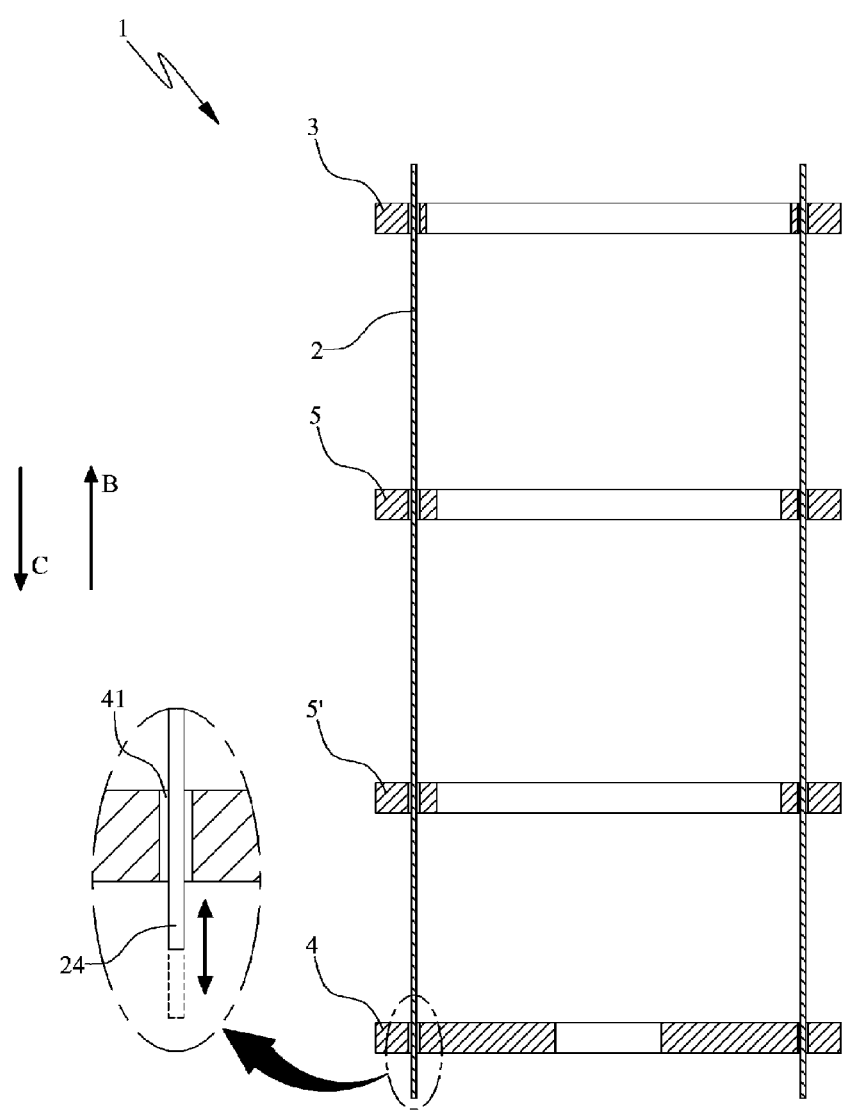
FIG. 3 is a cross-sectional side view along I-I of FIG. 2.
Figure 4:
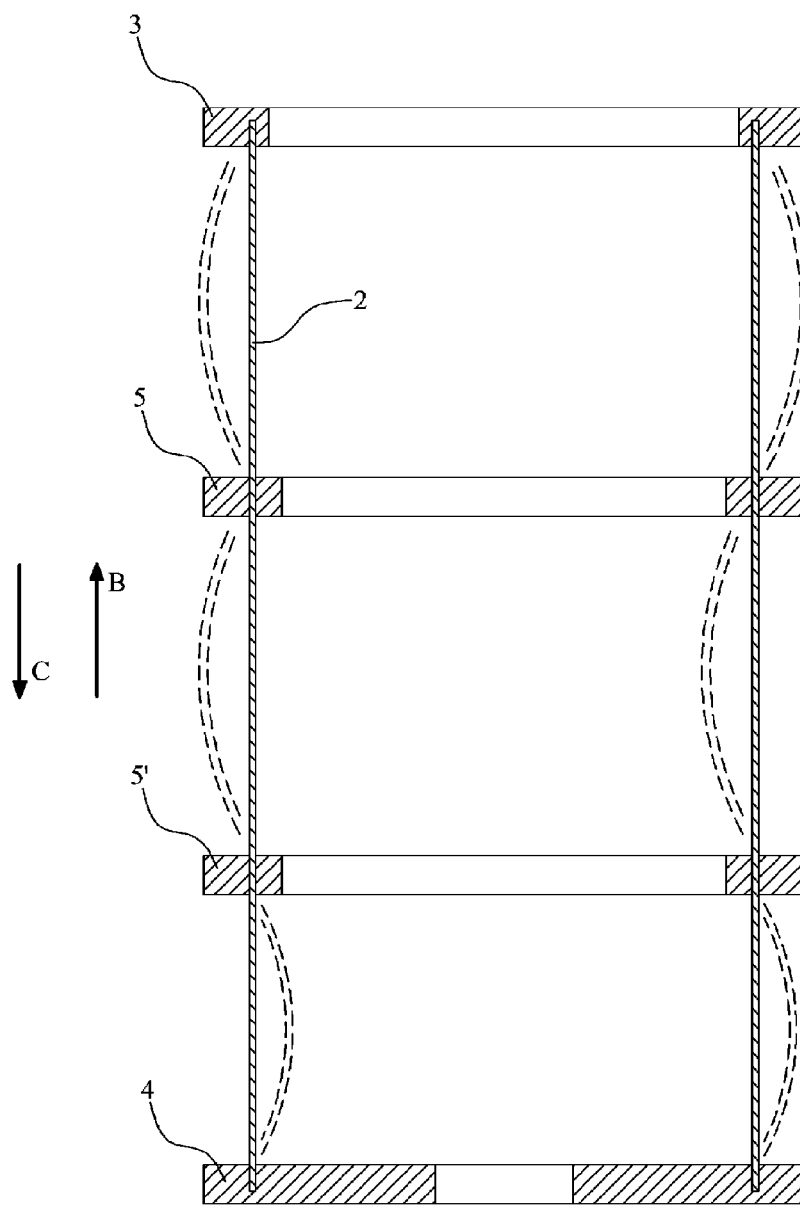
FIG. 4 is a cross-sectional side view for explaining problems occurring when both ends of a heating member are supported.

Referring to FIGS. 2 to 4, the heating apparatus 1 according to the present invention includes a heating member 2 for emitting the heat so as to heat the material, a first installing device 3 for supporting the heating member 2, and a second installing device 4 provided at a predetermined interval from the first installing device 3. One end of the heating member 2 is installed in the first installing device 3, and the other end of the heating member 2 is installed in the second installing device 4.

During a process for emitting the heat, the heating member 2 may be deformed by the heat, whereby the heating member 2 may expand or shrink. In this case, as shown in FIG. 4, if the heating member 2 is combined while being inserted into the first installing device 3 and the second installing device 4, both ends of the heating member 2 are respectively supported by the first installing device 3 and the second installing device 4. On assumption that the heating member 2 expands by the heat, since both ends of the heating member 2 are supported by the first installing device 3 and the second installing device 4, the heating member 2 may be bent as shown in a dotted line of FIG. 4. Thus, the heating member 2 may be damaged or broken by partial disconnection or short, so that it is impossible to carry out a process for heating the material. As the heating member 2 is bent, it is difficult to uniformly maintain a distance between each portion of the heating member 2 and the material, that is, it is difficult to uniformly heat the material.

In order to overcome this problem, as shown in FIG. 3, the heating apparatus 1 according to the present invention is provided with the second installing device 3 which includes a passing hole 41 for passing the heating member 2 therethrough. If the heating member 2 is deformed by the heat during the process for emitting the heat so as to heat the material, the heating member 2 may freely expand or shrink through the passing hole 41 of the second installing device 4. That is, even though the heating member 2 expands by the heat, the expanded heating member 2 does not interfere with the second installing device 4 through the use of passing hole 41. Also, even though the heating member 2 shrinks by the heat, the shrunken heating member 2 does not interfere with the second installing device 4 through the use of passing hole 41. Accordingly, the heating apparatus 1 according to the present invention achieves the following efficiency.

First, even though the heating member 2 expands or shrinks due to the deformation caused by the heat in the heating apparatus 1 according to the present invention, the heating member 2 passes through the passing hole 41, to thereby prevent the heating member 2 from being bent. That is, it is possible to prevent the heating member 2 from being damaged or broken by partial disconnection or short during the process for emitting the heat. Accordingly, the heating apparatus 1 according to the present invention facilitates to improve stability in the process for heating the material, and further to improve stability in a process for depositing the thin film on the substrate (See '100' of FIG. 1).

Also, the heating apparatus 1 according to the present invention prevents the heating member 2 from being deformed and bent by the heat, to thereby extend a period for repair or replacement of the heating member 2. Thus, the heating apparatus 1 according to the present invention enables to prevent working hours from being wasted due to the process of repair or replacement of the heating member 2, to thereby promote productivity for a process of manufacturing the display device.

In addition, the heating apparatus 1 according to the present invention prevents the heating member 2 from being deformed and bent by the heat, which enables to uniformly maintain the distance between each portion of the heating member 2 and the material. Thus, the heating apparatus 1 according to the present invention facilitates to uniformly heat the material, to thereby improve uniformity in the thin film deposited on the substrate (See '100' of FIG. 1).

Hereinafter, the heating member 2, the first installing device 3 and the second installing device 4 will be described in detail with reference to the accompanying drawings.

Figure 5:
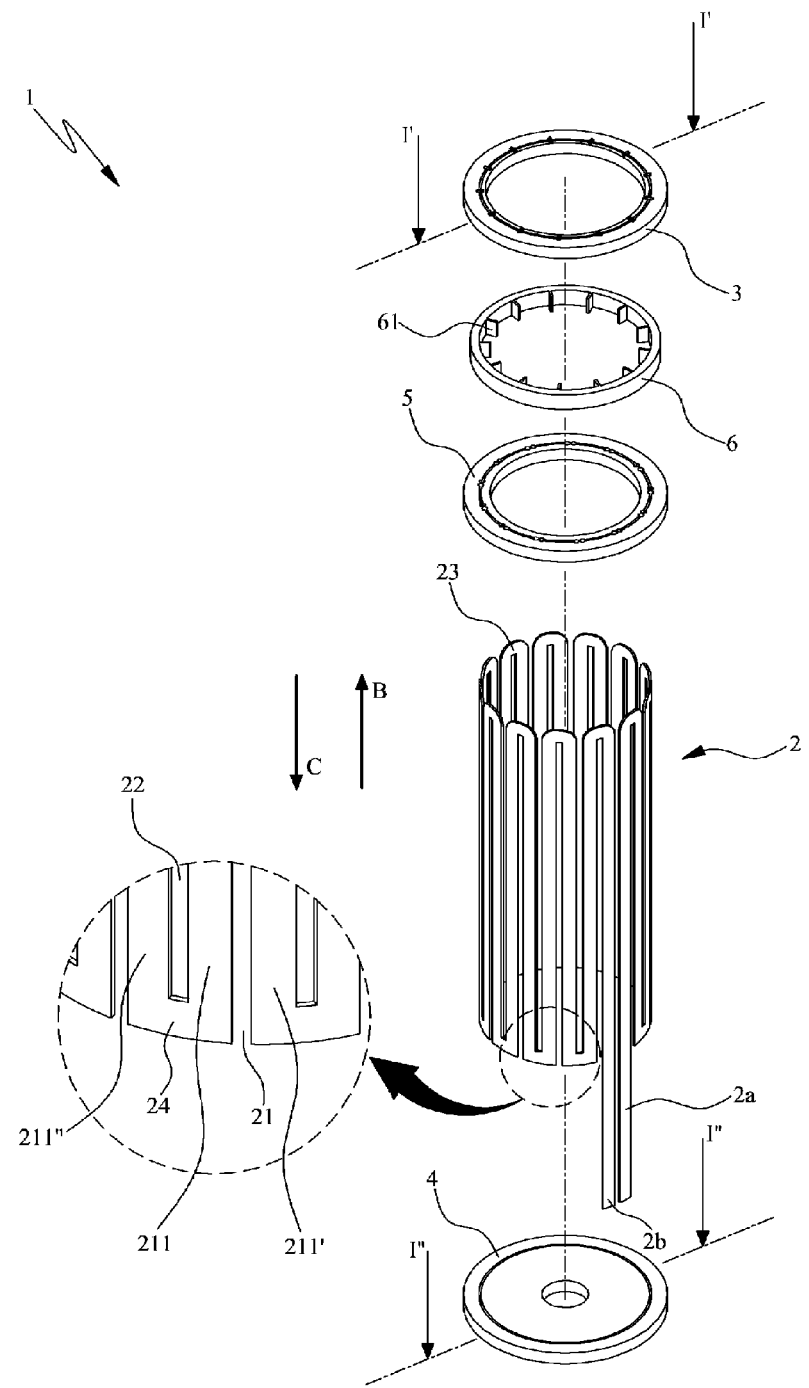
FIG. 5 is an exploded perspective view illustrating the heating apparatus for manufacturing a display device according to the present invention.

Referring to FIGS. 2, 3 and 5, the heating member 2 emits the heat so as to heat the material. The heating member 2 is installed in the first installing device 3 and the second installing device 4. The material held in the container (not shown) is positioned inside the heating member 2. Herein, the container (not shown) may be a crucible. The heating member 2 is formed in a shape surrounding the container (not shown). For example, the heating member 2 may be formed in a hollow cylinder surrounding the container (not shown).

The heating member 2 may include a connection member 2a connected with a power source (not shown). If the connection member 2a is supplied with power from the power source, the heating member 2 emits the heat, to thereby heat the material. The heating member 2 may include the two connection members 2a and 2b. In this case, one connection member 2a is connected with an anode (+) of the power source, and the other connection member 2b is connected with a cathode (−) of the power source. If the heating member 2 is installed in the first installing device 3 and the second installing device 4, the connection members 2a and 2b expanding from the second installing device 4 may be connected with the power source. The heating member 2 may be connected with the connection member 2a connected with the anode (+) and the connection member 2b connected with the cathode (−) in a body. If the heating member 2 is supplied with power, the heating member 2 emits the heat, wherein an example of the heating member 2 may be a filament.

When one end of the heating member 2 is installed in the first installing device 3, one end of the heating member 2 is supported by the first installing device 3. The other end of the heating member 2 is installed in the second installing device 4 through the passing hole 41. As the heating member 2 is deformed by the heat, the heating member 2 may expand or shrink with respect to its portion supported by the first installing device 3. In this case, the heating member 2 may expand or shrink through the passing hole 41 without interfering with the second installing device 4. Thus, the heating apparatus 1 according to the present invention facilitates to prevent the heating member 2 from being damaged or broken by partial disconnection or short, and to extend the replacement period of the heating member 2.

The heating member 2 includes an inserting groove (See '21' in an expanded portion of FIG. 5) into which the first installing device 3 is inserted. The inserting groove 21 is formed in a direction toward the first installing device 3 from the second installing device 4 (hereinafter, referred to as 'first direction', a direction of arrow B). The inserting groove 21 may be obtained by forming a groove in the first direction (direction of arrow B) of the heating member 2. As the heating member 2 is supported by the first installing device 3 inserted into the inserting groove 21, the heating member 2 deformed by the heat may expand or shrink with respect to its portion supported by the first installing device 3. The inserting groove 21 may be formed in a rectangular plate shape, but not limited to this shape. For example, the inserting groove 21 may be formed in any shape enabling to accept the first installing device 3 inserted thereinto. The heating member 2 may include the plurality of inserting grooves 21. The plurality of inserting grooves 21 may be provided at fixed intervals along the side of the heating member 2 formed in the cylindrical shape.

The heating member 2 includes a separating groove (See '22' in an expanded portion of FIG. 5) which is formed in a direction toward the second installing device 4 from the first installing device 3 (hereinafter, referred to as 'second direction, a direction of arrow C). The separating groove 22 may be obtained by forming a groove in the second direction (direction of arrow C) of the heating member 2. The separating groove 22 may be formed in a rectangular plate shape, but not limited to this shape. For example, the separating groove 22 may be formed in another shape such as an elliptical shape. The inserting groove 21 and the separating groove 22 may be formed in the same shape and size, and may be provided in opposite directions to each other. The heating member 2 may include the plurality of separating grooves 22. The plurality of separating grooves 22 may be provided at fixed intervals along the side of the heating member 2 formed in the cylindrical shape.

As shown in FIG. 5, the inserting groove 21 and the separating groove 22 are alternately arranged along the curved side of the heating member 2. The plurality of inserting groove 21 and the plurality of separating grooves 22 may be alternately arranged at fixed intervals along the side of the heating member 2. Thus, respective portions 211, 211' and 211" divided by the plurality of inserting grooves 21 and the plurality of separating grooves 22 have the same size so that the same electric resistance is formed in each of the respective portions 211, 211' and 211". Accordingly, the heating apparatus 1 according to the present invention facilitates to improve uniformity of temperature in the heat emitted from the heating member 2, to thereby uniformly heat the material. Also, the heating member 2 is easily deformed to form the cylindrical shape by the use of inserting grooves 21 and separating grooves 22, whereby the heating member 2 is easily installed in the first installing device 3 and the second installing device 4. Thus, the heating apparatus 1 according to the present invention enables to improve easiness in operation of installing the heating member 2 in the first installing device 3 and the second installing device 4. The heating member 2 may be formed in one body by connecting the connection member 2a connected with the anode (+) to the connection member 2b connected with the cathode (−) through the portion with the inserting groove 21 and the inserting groove 22.

Figure 6:
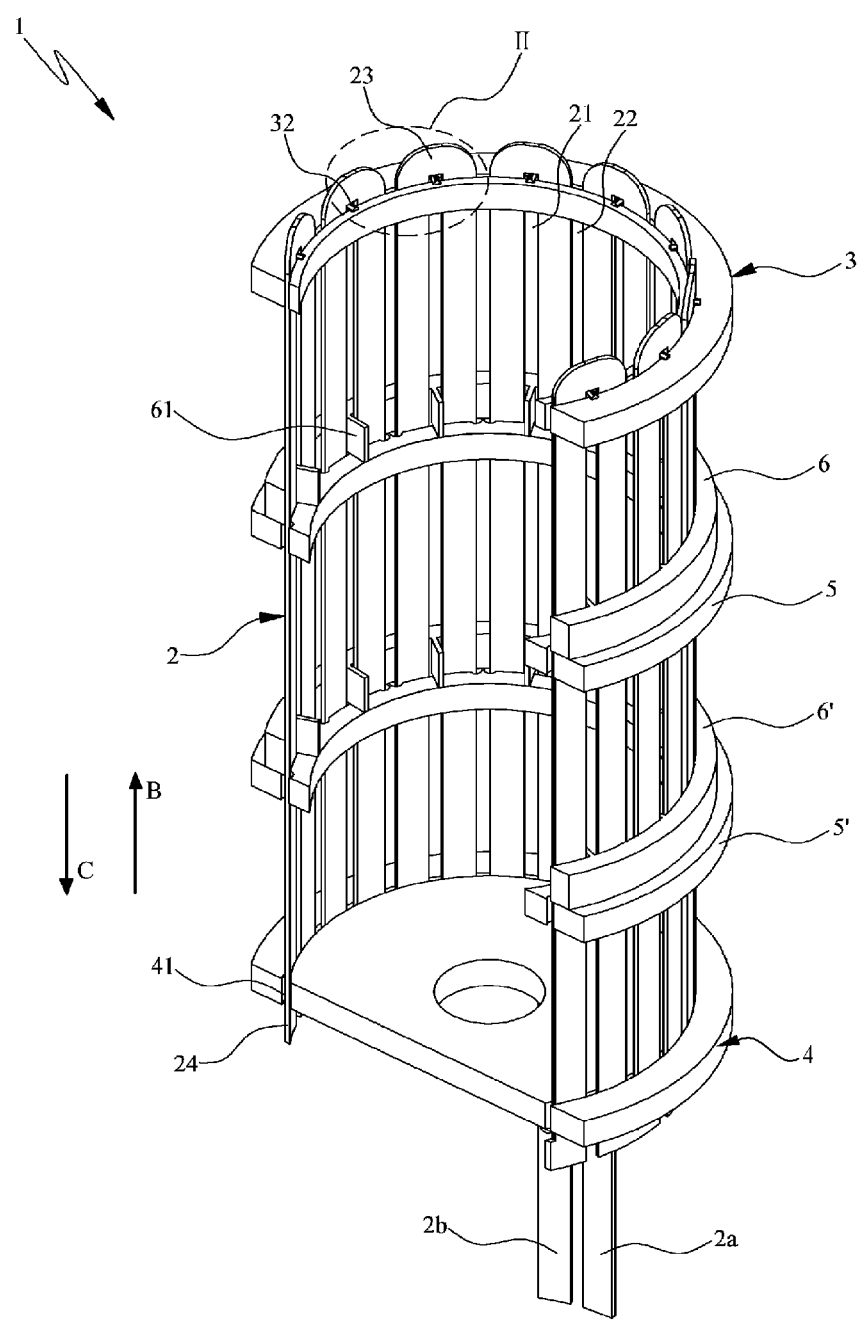
FIG. 6 is a perspective view illustrating a partial portion of the heating apparatus for manufacturing a display device according to the present invention.
Figure 7:
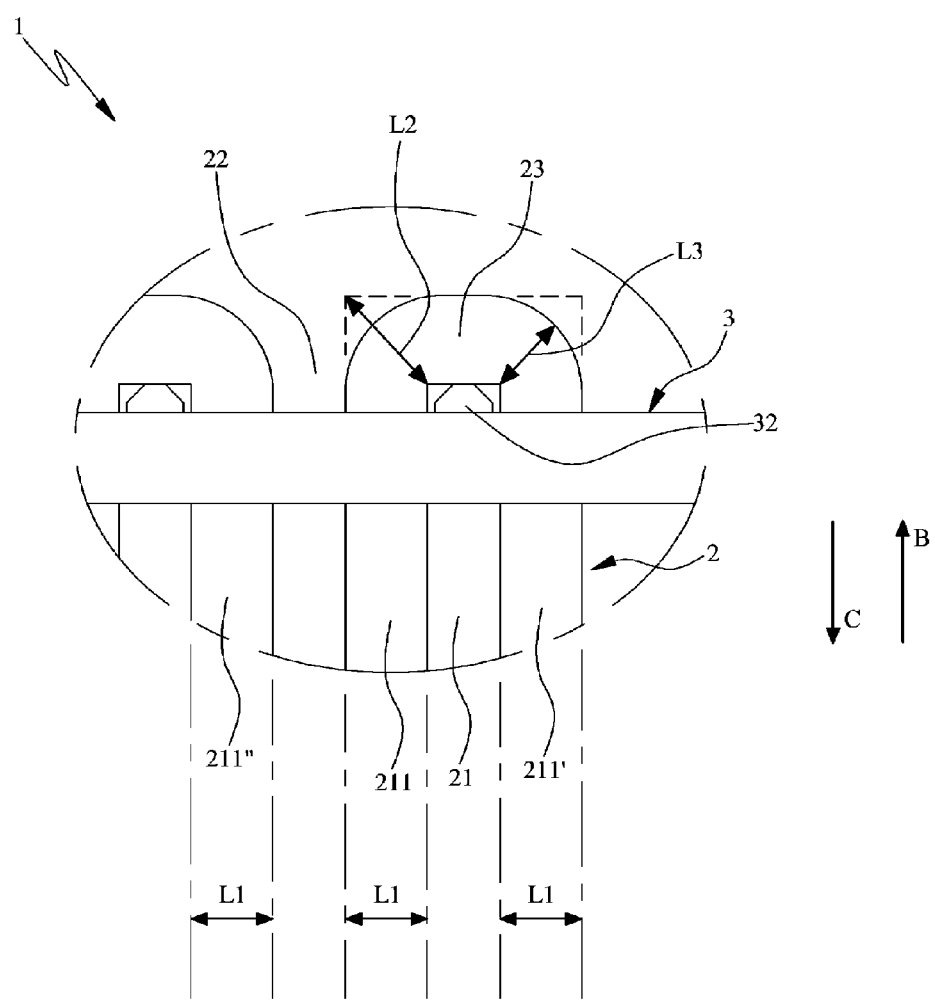
FIG. 7 is a front view illustrating an expanded II portion of FIG. 6.
Figure 8:
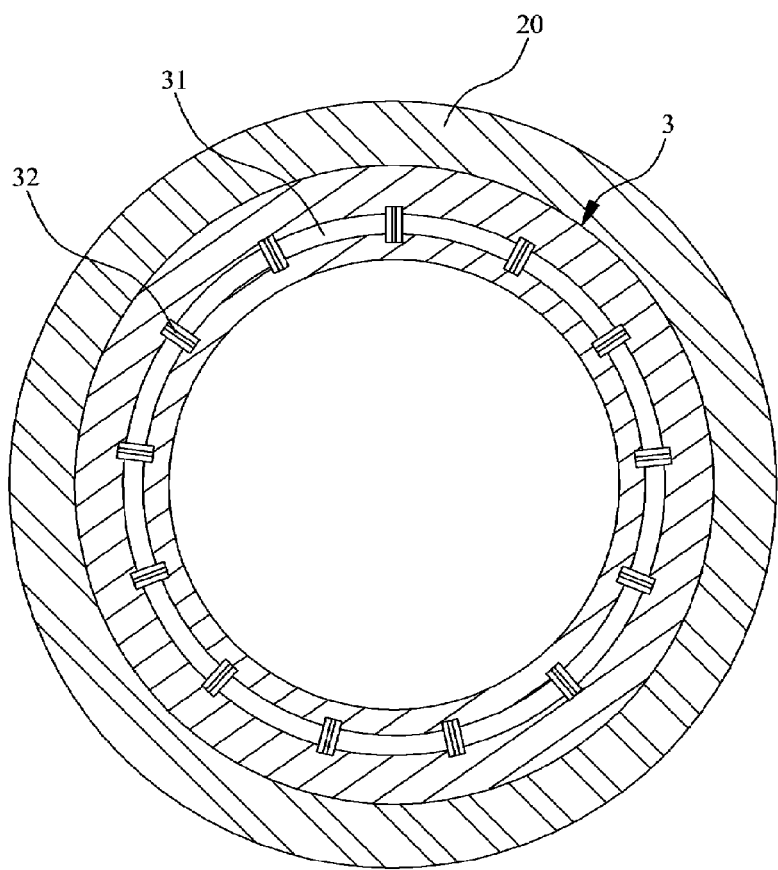
FIG. 8 is a plane view illustrating a cross section of a first installing device along I'-I' of FIG. 5.
Figure 9:
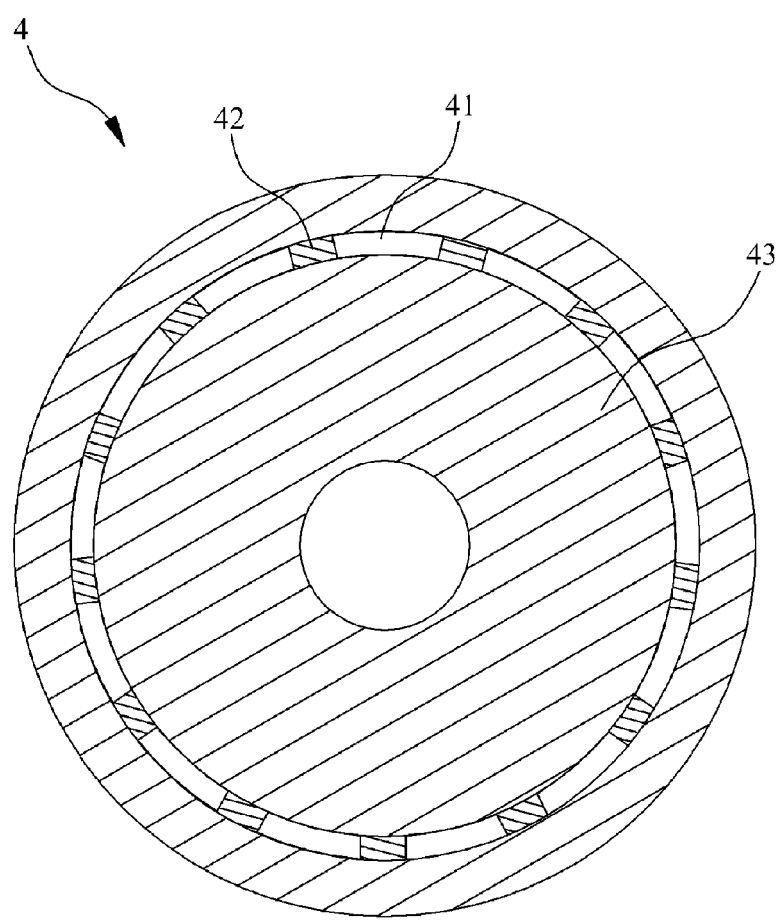
FIG. 9 is a plane view illustrating a cross section of a second installing device along I"-I" of FIG. 5.
Figure 10:
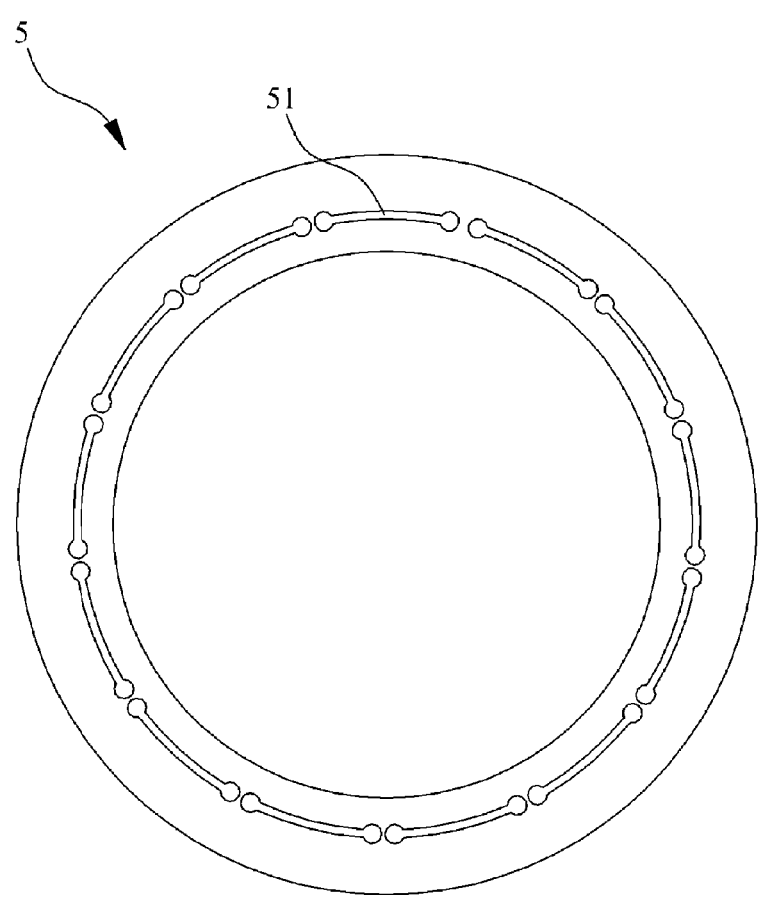
FIG. 10 is a plane view illustrating a third installing device according to the present invention.
Figure 11:
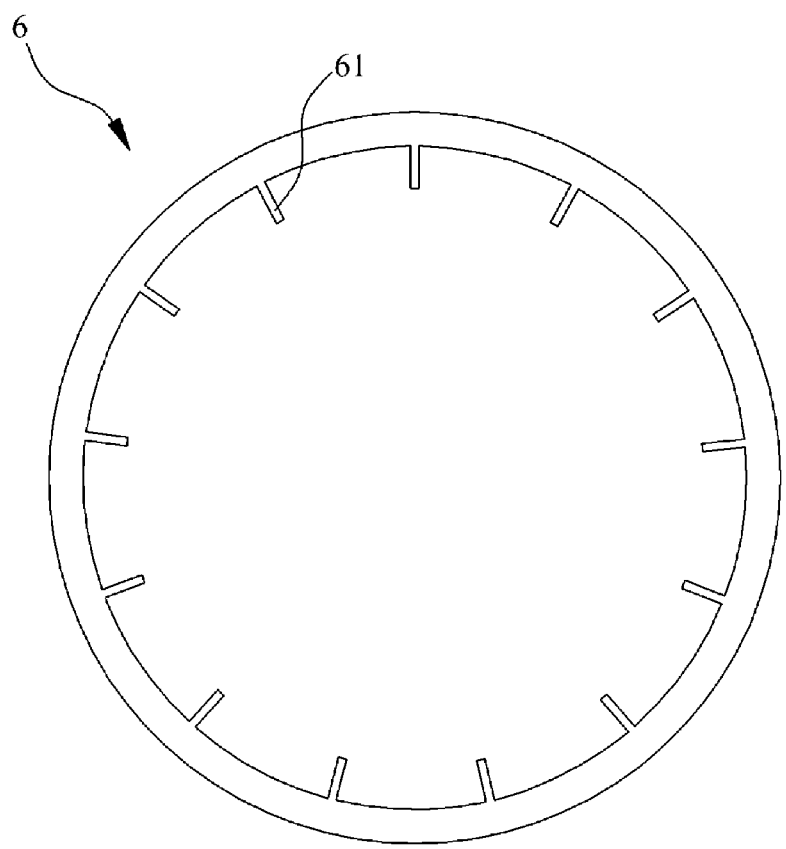
FIG. 11 is a plane view illustrating a spacer according to the present invention.

Referring to FIGS. 6 and 7, the heating member 2 may include a first protruding member 23. Under the condition that the first protruding member 23 provided in the first direction (direction of arrow B) is protruding out of the first installing device 3, the heating member 2 is supported by the first installing device 3, whereby the heating member 2 is installed in the first installing device 3. The first protruding member 23 connects the two portions 211 and 211' (See FIG. 7), divided by forming the inserting groove 21 in the heating member 2, with each other. The heating member 2 may include the plurality of first protruding members 23.

As shown in FIG. 7, the first protruding member 23 may have a curved surface protruding out of the first installing device 3. Thus, the respective portions 211, 211' and 211" of the heating member 2, which are divided by the plurality of inserting grooves 21 and the plurality of separating grooves 22, have the roughly identical size, and the respective first protruding members 23 have the roughly identical size, to thereby form the roughly identical electric resistance in the respective portions of the heating member 2. Accordingly, the heating apparatus 1 according to the present invention facilitates to improve uniformity of temperature in the heat emitted from the heating member 2, to thereby uniformly heat the material. This will be described in detail as follows.

First, as shown in FIG. 7, the respective portions 211, 211' and 211" of the heating member 2, which are divided by the plurality of inserting grooves 21 and the plurality of separating grooves 22, have the same width (first width, L1). In this case, as shown in a dotted line of FIG. 7, if the first protruding member 23 is formed in a rectangular shape, a corner of the first protruding member 23 has a width (L2) which is larger than the first width (L1). Thus, if the first protruding member 23 is formed in the rectangular shape, the respective portions 211, 211' and 211", divided by the plurality of inserting grooves 21 and the plurality of separating grooves 22, and the first protruding member 23 have the different sizes so that the different electric resistances are formed therein, to thereby lower uniformity of temperature in the heat emitted from the heating member 2.

Next, as shown in a solid line of FIG. 7, if the first protruding member 23 is formed with the curved surface, a corner of the first protruding member 23 has a width (L3) which is approximately similar to the first width (L1). Thus, if the first protruding member 23 is formed with the curved surface, the respective portions 211, 211' and 211", divided by the plurality of inserting grooves 21 and the plurality of separating grooves 22, and the first protruding member 23 have the roughly identical size so that the roughly identical electric resistance is formed therein, to thereby improve uniformity of temperature in the heat emitted from the heating member 2. The first protruding member 23 may be entirely provided with the width which is roughly identical to the first width (L1). Accordingly, the heating apparatus 1 according to the present invention further improves uniformity of temperature in the heat emitted from the heating member 2, to thereby more uniformly heat the material. Although not shown, a predetermined portion of the inserting groove 21, which is adjacent to the first protruding member 23, may be formed with a curved surface whose curvature is identical to that of the first protruding member 23.

Referring to FIGS. 5 to 7, the heating member 2 may include a second protruding member (See '24' of FIG. 6). The second protruding member 24 of the heating member 2 may protrude out of the second installing device 4, wherein the second protruding member 24 is provided in the second direction (direction of arrow C). The second protruding member 24 may protrude out of the second installing device 4 through the passing hole (See '41' of FIG. 6). The second protruding member 24 connects the two portions 211 and 211' (See FIG. 7), divided by forming the inserting groove 21 in the heating member 2, with each other. The heating member 2 may include the plurality of second protruding members 24. The second protruding member 24 may be formed in a rectangular shape. Although not shown, the second protruding member 24 may have a curved surface protruding out of the second installing device 4. Although not shown, a predetermined portion of the separating groove 22, which is adjacent to the second protruding member 24, may be formed with a curved surface whose curvature is identical to that of the second protruding member 24. Although not shown, if the heating member 2 shrinks, the second protruding member 24 may be positioned inside the second installing device 4 without protruding out of the second installing device 4 in the second direction (direction of arrow C).

Referring to FIGS. 5 to 8, the first installing device 3 supports the heating member 2. The first installing device 3 is provided at a predetermined interval in the first direction (direction of arrow B) from the second installing device 4. The first installing device 3 may be combined with a cover (See '20' of FIG. 8). The cover 20 is provided to cover the first installing device 3. The cover 2 is formed in a hollow cylinder shape for receiving the heating member 2, the first installing device 3 and the second installing device 4 therein. The first installing device 3 is combined with the cover 20 by the use of coupling means such as bolt, to thereby support the heating member 2. The first installing device 3 may be formed of an insulating material. For example, the first installing device 3 may be formed of ceramic.

The first installing device 3 includes an installing hole (See '31' of FIG. 8) in which the heating member 2 is installed. The installing hole 31 penetrates the first installing device 3. The other end of the heating member 2 is inserted into the installing hole 31, and is then inserted into the passing hole (See '41' of FIG. 6) through the first installing device 3, and the first protruding member 23 is supported by the first installing device 3, whereby the heating member 2 is installed in the first installing device 3. The first installing device 3 may be formed in a circular ring shape. The installing hole 31 penetrates the first installing device 3 along the circumference of the first installing device 3. Herein, a size of the installing hole 31 may be roughly identical to or larger than a thickness of the heating member 2. Although not shown, the first installing device 3 may include the plurality of installing holes 31. In this case, the plurality of installing holes 31 may be provided at fixed intervals along the circumference of the first installing device 3.

The first installing device 3 includes a supporting member 32 for supporting the heating member 2. The supporting member 32 inserted into the inserting groove (See '21' of FIG. 7) supports the heating member 2. As the supporting member 32 supports the first protruding member 23, the heating member 2 is supported by the supporting member 32. The second protruding member (See '24' of FIG. 6) passing through the passing hole (See '41' of FIG. 6) is not supported by the second installing device 4. Thus, when the heating member 2 is deformed by the heat, the heating member 2 may expand or shrink with respect to the supporting member 32.

The supporting member 32 may be formed in a direction crossing the installing hole 31. Accordingly, a predetermined portion of the installing hole 31, which is provided with the supporting member 32, is blocked by the supporting member 32, to thereby prevent the heating member 2 from being separated through the installing hole 31. Also, the supporting member 32 prevents the respective portions 211 and 211' (See FIG. 7) divided by the inserting groove 21 from being in contact with each other. In the heating apparatus 1 according to the present invention, the respective portions 211 and 211' positioned at both sides of the supporting member 32 are separated from each other by the supporting member 32, so that it is possible to prevent short occurring when the respective portions 211 and 211' divided by the inserting groove 21 are brought into contact with each other.

The supporting member 32 may protrude in the first direction (direction of arrow B). Thus, the supporting member 32 enables to provide the first protruding member 23 at a predetermined distance from the first installing device 3. That is, the supporting member 32 makes the first protruding member 23 provided at the predetermined distance from the first installing device 3. Thus, the supporting member 32 enables to decrease a contact area between the first protruding member 23 and the first installing device 3, to thereby decrease an influence on the process for heating the material. If the heating member 2 includes the plurality of inserting grooves 21, the first installing device 3 may include the plurality of supporting members 32. The plurality of supporting members 32 may be provided at fixed intervals along the circumference of the first installing device 3. In this case, the plurality of supporting members 32 are provided in such a manner that a distance between each of the supporting members 32 is roughly identical to a distance between each of the inserting grooves 21. The number of supporting members 32 included in the first installing device 3 may be roughly identical to the number of inserting grooves 21.

Referring to FIGS. 5 to 9, the second installing device 4 is provided at a predetermined interval in the second direction (direction of arrow C) from the first installing device 3. The second installing device 4 may be combined with the cover (See '20' of FIG. 8) by the use of coupling means such as bolt. The second installing device 4 may be formed of an insulating material. For example, the second installing device 4 may be formed of ceramic.

The second installing device 4 includes the passing hole (See '41' of FIG. 9) through which the other end of the heating member 2 passes. The passing hole 41 passes through the second installing device 4. Accordingly, if the heating member 2 is deformed by the heat during the process for emitting the heat so as to heat the material, the heating member 2 may expand or shrink through the passing hole 41 of the second installing device 4. That is, even though the heating member 2 expands by the heat, the expanded heating member 2 does not interfere with the second installing device 4 through the use of passing hole 41. Also, even though the heating member 2 shrinks by the heat, the shrunken heating member 2 does not interfere with the second installing device 4 through the use of passing hole 41.

In the heating apparatus 1 according to the present invention, even though the heating member 2 expands or shrinks due to the deformation caused by the heat, the heating member 2 passes through the passing hole 41, to thereby prevent the heating member 2 from being bent. That is, it is possible to prevent the heating member 2 from being damaged or broken by partial disconnection or short during the process for emitting the heat. Accordingly, the heating apparatus 1 according to the present invention facilitates to improve stability in the process for heating the material. Also, the heating apparatus 1 according to the present invention prevents the heating member 2 from being deformed and bent by the heat, to thereby extend a period for repair or replacement of the heating member 2. Thus, the heating apparatus 1 according to the present invention enables to prevent working hours from being wasted due to the process of repair or replacement of the heating member 2, to thereby promote productivity for a process of manufacturing the display device.

The second installing device 4 may be formed in a circular ring shape. The passing hole 41 penetrates the second installing device 4 along the circumference of the second installing device 4. Herein, a size of the passing hole 41 may be roughly identical to or larger than a thickness of the heating member 2. Also, the size of the passing hole 41 may be roughly identical to or larger than that of the second protruding member (See '24' of FIG. 5). The second installing device 4 may include the plurality of passing holes 41. In this case, the plurality of passing holes 41 may be provided at fixed intervals along the circumference of the second installing device 4. The connection members 2a and 2b (See FIG. 5) may be connected with the power source by passing the second installing device 4 through the passing hole 41.

When the heating member 2 is deformed by the heat, and is expanded in the lower direction influenced by gravity, the expanded heating member 2 passes through the passing hole 41. In this case, the second installing device 4 may be provided at a predetermined interval in the lower direction from the first installing device 3. That is, the second direction (direction of arrow C) may be the same as the direction in which the heating member 2 is influenced by gravity. Thus, if the heating apparatus 1 according to the present invention is deformed by the heat, and is then expanded, it is possible to induce the heating member 2 expanded in the direction of the passing hole 41 with respect to the portion supported by the first installing device 3 by the use of gravity. Accordingly, the heating apparatus 1 according to the present invention facilitates to prevent the heating member 2 from being damaged or broken by partial disconnection or short, and to extend the replacement period of the replacement of the heating member 2.

The second installing device 4 may include a separating member (See '42' of FIG. 9) to be inserted into the inserting groove (See '21' of FIG. 7). The separating member 42 may be formed in a direction crossing the passing hole 41. Accordingly, a predetermined portion of the passing hole 41, which is provided with the separating member 42, is blocked by the separating member 42. Thus, the separating member 42 prevents the respective portions 211 and 211' (See FIG. 5) divided by the inserting groove 21 from being in contact with each other. In the heating apparatus 1 according to the present invention, the respective portions 211 and 211' positioned at both sides of the separating member 42 are separated from each other by the separating member 42, so that it is possible to prevent short occurring when the respective portions 211 and 211' divided by the inserting groove 21 are brought into contact with each other. Also, the separating member 42 enables to provide the second protruding members 24 at fixed intervals, to thereby prevent short occurring when the second protruding members 24 are brought into contact with each other.

The second installing device 4 may include the plurality of separating members 42. The plurality of separating members 42 may be provided at fixed intervals along the circumference of the second installing device 4. In this case, the plurality of separating members 42 are provided in such a manner that a distance between each of the separating members 42 is roughly identical to a distance between each of the inserting grooves 21. The number of separating members 42 included in the second installing device 4 is roughly identical to the number of inserting grooves 21.

The second installing device 4 may include a holding-up member (See '43' of FIG. 9) for supporting the container with the material held therein. The holding-up member 43 may be positioned inside the passing hole 41. The holding-up member 43 may be formed in a discus shape, but not limited to this shape. For example, the holding-up member 43 may be formed in any shape capable of supporting the container.

Referring to FIGS. 5 to 10, the heating apparatus 1 according to the present invention includes a third installing device (See '5' of FIG. 5) to be installed with the heating member 2.

The third installing device 5 is positioned between the first installing device 3 and the second installing device 4. Accordingly, the third installing device 5 prevents a predetermined portion of the heating member 2, positioned between the first installing device 3 and the second installing device 4, from being moved by shock or vibration. The third installing device 5 may be combined with the cover (See '20' of FIG. 8) by the use of coupling means such as bolt. The third installing device 5 may be formed of an insulating material. For example, the third installing device 5 may be formed of ceramic.

The third installing device 5 includes a through hole (See '51' of FIG. 10) for passing the heating member 2 therethrough. The through hole 51 penetrates the third installing device 5. Accordingly, if the heating member 2 is deformed by the heat during the process for emitting the heat so as to heat the material, the heating member 2 may expand or shrink through the through hole 51 without interfering with the third installing device 5. That is, even though the heating member 2 expands by the heat, the expanded heating member 2 does not interfere with the third installing device 5 by the use of through hole 51. Also, even though the heating member 2 shrinks by the heat, the shrunken heating member 2 does not interfere with the third installing device 5 by the use of through hole 51. Thus, in the heating apparatus 1 according to the present invention, it is possible to prevent the predetermined portion of the heating member 2, positioned between the first installing device 3 and the second installing device 4, from being moved by shock or vibration, and also to prevent the heating member 2 from being bent when the heating member 2 expands or shrinks by the heat.

The third installing device 5 may be formed in a circular ring shape. The through hole 51 penetrates the third installing device 5 along the circumference of the third installing device 5. Herein, a size of the through hole 51 may be roughly identical to or larger than a thickness of the heating member 2. The third installing device 5 may include the plurality of through holes 51. In this case, the plurality of through holes 51 may be provided at fixed intervals along the circumference of the third installing device 5.

As shown in FIG. 2, the heating apparatus 1 according to the present invention may include the plurality of third installing devices 5. The plurality of third installing devices 5 and 5' may be provided at fixed intervals in the second direction (direction of arrow C). Thus, in the heating apparatus 1 according to the present invention, it is possible to enlarge a range of preventing the predetermined portion of the heating member 2, positioned between the first installing device 3 and the second installing device 4, from being moved by shock or vibration. Furthermore, the heating apparatus 1 according to the present invention enables to improve stability in the process for heating the material.

Referring to FIGS. 5 to 11, the heating apparatus 1 according to the present invention further includes a spacer (See '6' of FIG. 5) provided between the first installing device 3 and the second installing device 4.

The spacer 6 covers the predetermined portion of the heating member 2 positioned between the first installing device 3 and the second installing device 4. Thus, the spacer 6 prevents the predetermined portion of the heating member 2, positioned between the first installing device 3 and the second installing device 4, from being moved by shock or vibration. The spacer 6 may be combined with the cover (See '20' of FIG. 8) by the use of coupling means such as bolt. The spacer 6 may be combined with the third installing device 5. The spacer 6 may be formed in a circular ring shape. The spacer 6 may be formed of an insulating material. For example, the spacer 6 may be formed of ceramic.

The spacer 6 may include an inserting member (See '61' of FIG. 11) inserted into the inserting groove (See '21' of FIG. 7). The inserting member 61 protrudes toward the inside provided with the heating member 2. Accordingly, the respective portions 211 and 211' (See FIG. 5), divided by the inserting groove 21 in the heating member 2, are separated from each other owing to the inserting member 61, to thereby prevent the respective portions 211 and 211' divided by the inserting groove 21 from being in contact with each other. Thus, in the heating apparatus 1 according to the present invention, the respective portions 211 and 211' positioned at both sides of the inserting member 61 are separated from each other by the inserting member 61, so that it is possible to prevent short occurring when the respective portions 211 and 211' divided by the inserting groove 21 are brought into contact with each other.

The inserting member 61 may protrude from the spacer 6, wherein the inserting member 61 having a predetermined length may be formed in at least one direction of the first direction (direction of arrow B) and the second direction (direction of arrow C). Thus, in the heating apparatus 1 according to the present invention, the inserting member 61 enables to enlarge a range of maintaining the separated state of the respective portions 211 and 211' divided by the inserting groove 21 in the heating member 2, to thereby lower a possibility of short. Thus, the heating apparatus 1 according to the present invention enables to uniformly heat the material, and to improve stability in the process for heating the material. If the second direction (direction of arrow C) corresponds to the direction influenced by gravity, the inserting member 61 may be formed in a rectangular plate shape being erect in the vertical direction (Z-axis direction, shown in FIG. 2).

The spacer 6 may include the plurality of inserting members 61. The plurality of inserting member 61 may be provided at fixed intervals along the circumference of the spacer 6. In this case, the plurality of inserting members 61 are provided in such a manner that a distance between each of the inserting members 61 is roughly identical to a distance between each of the inserting grooves 21. The number of inserting members 61 included in the spacer 6 is roughly identical to the number of inserting grooves 21.

As shown in FIG. 2, the heating apparatus 1 according to the present invention may include the plurality of spacers 6. The plurality of spacers 6 and 6' are provided at fixed intervals in the second direction (direction of arrow C). Thus, the heating apparatus 1 according to the present invention lowers the possibility of short in the predetermined portion of the heating member 2 positioned between the first installing device 3 and the second installing device 4. Also, in the heating apparatus 1 according to the present invention, it is possible to enlarge the range of preventing the predetermined portion of the heating member 2, positioned between the first installing device 3 and the second installing device 4, from being moved by shock or vibration. Thus, the heating apparatus 1 according to the present invention enables to uniformly heat the material, and to improve stability in the process for heating the material.

According to the present invention, it is possible to prevent the heating member 2 from being bent when the heating member 2 expands or shrinks due to the deformation cause by the heat, to thereby prevent the heating member 2 from being damaged or broken by partial disconnection or short.

Also, it is possible to extend the period for repair or replacement of the heating member 2. Thus, the heating apparatus 1 according to the present invention enables to prevent working hours from being wasted due to the process of repair or replacement of the heating member 2, to thereby promote productivity for a process of manufacturing the display device.

In addition, the distance between the heating member 2 and the material is maintained uniformly so that it is possible to uniformly heat the material, to thereby realize high uniformity in thin film deposited on the substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A heating apparatus for manufacturing a display device comprising:
    a heating member for emitting heat so as to heat a material to be deposited on a substrate prepared for manufacturing the display device;
    a first installing device for supporting the heating member, wherein one end of the heating member is installed in the first installing device;
    a second installing device provided at a predetermined distance from the first installing device, wherein the other end of the heating member is installed in the second installing device;
    at least one third installing device positioned between the first installing device and the second installing device; and
    at least one spacer engaged with the at least one third installing device,
    wherein the second installing device includes a passing hole through which the other end of the heating member passes, and
    wherein the at least one spacer includes a plurality of inserting members respectively inserted into corresponding inserting grooves formed in the heating member, wherein the at least one spacer has a circular shape, and the plurality of inserting members extend inward toward the center of the circular shape.

2. The heating apparatus according to claim 1,
wherein the second installing device is provided at the predetermined distance from the first installing device in a lower direction influenced by gravity, and
the heating member, which is deformed by the heat and expanded in the lower direction influenced by gravity, passes through the passing hole in the lower direction.

3. The heating apparatus according to claim 1,
wherein the plurality of inserting grooves are formed in a direction toward the first installing device from the second installing device, and
the first installing device includes a plurality of supporting members inserted into the respective inserting grooves so as to support the heating member.

4. The heating apparatus according to claim 1,
wherein the plurality of inserting grooves are formed in a direction toward the first installing device from the second installing device,
the second installing device includes a plurality of separating members to be inserted into the respective inserting grooves, and
respective portions of the heating member, positioned at each of the separating members, are separated from each other by the each of separating members.

5. The heating apparatus according to claim 1, further comprising a third installing device positioned between the first installing device and the second installing device, wherein the third installing device includes a through hole for passing the heating member therethrough.

6. The heating apparatus according to claim 5, wherein the plurality of third installing devices are provided at fixed intervals in a direction toward the second installing device from the first installing device.

7. The heating apparatus according to claim 1,
wherein the plurality of inserting grooved are formed in a direction toward the first installing device from the second installing device, and
wherein the spacer includes the plurality of inserting members to be inserted into the respective inserting grooves, and respective portions positioned at both sides of each of the inserting members are separated from each other by the spacer.

8. The heating apparatus according to claim 7, wherein of further comprising additional spaces that are provided at fixed intervals in the direction toward the second installing device from the first installing device.

9. The heating apparatus according to claim 1, wherein the heating member includes a plurality of separating grooves in a direction toward the second installing device from the first installing device, wherein the plurality of inserting grooves and separating grooves are arranged alternately along a curved side of the heating member.

10. The heating apparatus according to claim 1, wherein the heating member includes a first protruding member, wherein the first protruding member, which protrudes out of the first installing device in a direction toward the first installing device from the second installing device, is supported by the first installing device, and the first protruding member has a curved surface protruding from the first installing device.

11. The heating apparatus according to claim 1, wherein the heating member includes a first protruding member and a second protruding member,
wherein the first protruding member protrudes out of the first installing device,
wherein the second protruding member protrudes out of the second installing device through the passing hole.

12. The heating apparatus according to claim 1, wherein the heating member includes connection members, wherein the connection members are connected with a power source by passing the second installing device through the passing hole.

13. The heating apparatus according to claim 1, wherein the at least third installing device includes a through hole through which the heating member passes.

* * * * *